United States Patent

Sezi et al.

[11] Patent Number: 5,229,258
[45] Date of Patent: Jul. 20, 1993

[54] METHOD FOR PRODUCING A RESIST STRUCTURE

[75] Inventors: Recai Sezi, Röttenbach; Horst Borndörfer, Erlangen; Eva Rissel, Forchheim; Rainer Leuschner, Erlangen; Michael Sebald, Hessdorf-Hannberg; Hellmut Ahne, Röttenbach; Siegfried Birkle, Höchstadt A/Aisch, all of Fed. Rep. of Germany

[73] Assignee: Siemens Aktiengesellschaft, Munich, Fed. Rep. of Germany

[21] Appl. No.: 682,142

[22] Filed: Apr. 8, 1991

[30] Foreign Application Priority Data

Apr. 12, 1990 [EP] European Pat. Off. ............ 90107013

[51] Int. Cl.$^5$ ................................................ G03F 7/36
[52] U.S. Cl. ..................................... 430/325; 430/313; 430/323; 430/328; 430/330
[58] Field of Search ............... 430/326, 328, 330, 325, 430/323, 313; 156/643

[56] References Cited

U.S. PATENT DOCUMENTS

| 4,196,003 | 4/1980 | Watanabe | 430/193 |
|---|---|---|---|
| 4,491,628 | 1/1985 | Ito et al. | 430/270 |
| 4,496,647 | 1/1985 | Kawabe et al. | 430/303 |
| 4,613,398 | 9/1986 | Chiong et al. | 156/628 |
| 4,657,845 | 4/1987 | Frechet et al. | 430/326 |
| 4,810,601 | 3/1989 | Allen et al. | 430/18 |
| 4,908,298 | 3/1990 | Hefferson et al. | 430/326 |
| 5,053,314 | 10/1991 | Yanaoka et al. | 430/176 |

FOREIGN PATENT DOCUMENTS

| 1248402 | 1/1989 | Canada . |
|---|---|---|
| 0100938 | 2/1984 | European Pat. Off. . |
| 0136130 | 4/1985 | European Pat. Off. . |
| 0204253 | 12/1986 | European Pat. Off. . |
| 0229917 | 7/1987 | European Pat. Off. . |
| 0251241 | 1/1988 | European Pat. Off. . |
| 0354536 | 2/1990 | European Pat. Off. . |
| 0394740 | 10/1990 | European Pat. Off. . |

OTHER PUBLICATIONS

SPIE vol. 1086: Advances in Resist Technology and Processing VI (1989), pp. 220–228.
J. Vac. Sci. Technol. B, vol. 7 (1989), pp. 1782–1786, American Vacuum Society.

Primary Examiner—Marion E. McCamish
Assistant Examiner—Christopher D. RoDee
Attorney, Agent, or Firm—Kenyon & Kenyon

[57] ABSTRACT

High resolution resist structures with steep edges are obtained using standard equipment, even in cases involving critical contact-hole planes. First, a photoresist layer containing a polymer with chemically reactive groups and a photoactive component based on diazoketone or quinone diazide is deposited on a substrate. The photoresist layer is then irradiated with a patterned image and treated with a polyfunctional organic compound having functional groups that can chemically react with the reactive groups of the polymer. This step is followed by a maskless flood exposure. The photoresist layer irradiated in this manner is then treated with a metal-containing organic compound having at least one functional group capable of chemical reaction with the reactive groups of the polymer, followed by etching in an oxygen-containing plasma.

20 Claims, No Drawings

METHOD FOR PRODUCING A RESIST STRUCTURE

BACKGROUND OF THE INVENTION

The present invention relates to a method for producing high resolution resist structures with steep edges.

The production of resist structures plays an important role in microelectronics. For example photoresists are structured using photolithographic means in the manufacture of semiconductor components. One consequence of the recent advances in microelectronics, however, is an increase in the level of integration. Also, with smaller and smaller structures, increasing demands are placed on structure production. To meet these demands, greater resolution or higher contrast is required of the applied photoresists.

When photoresists are structured using photolithographic means, in addition to the technology- and resist-specific parameters, the properties of the stepper or the stepper lens used for irradiation also determine the minimum attainable structure size, critical dimension (CD), as well as the depth of focus (DOF). The stepper-specific variables, exposure wavelength $\lambda$ and lens numerical aperture (NA), are related to CD and the DOF as follows:

$$CD = f_1 (\lambda/NA) \text{ and } DOF = \pm f_2 (\lambda/NA^2);$$

wherein $f_1$ and $f_2$ are factors which are specific to the processing equipment.

For some time, the demands of photolithography have been satisfied by liquid-developable, single-layer resists, particularly those consisting of novolak resins (as a base polymer) and quinone diazides (as a photoactive component). Such resist systems, however, may be unable to meet future requirements. For example, when thick resists are processed using excimer laser steppers in the deep-ultra-violet (DUV) range, it may be impossible to produce relief structures having steep edges and dimensions of less than 0.5 $\mu$m. This is particularly true of graduated substrate topographies and highly reflective sub-layers. To produce very small structures, shorter exposure wavelengths and high numerical apertures are needed. Unfortunately, this reduces the range of the depth of focus, making it very difficult to use liquid-developable single-layer resists (with relatively thick resist layers and unavoidable fluctuations in layer thickness) when high resolution on graduated topographies is required. In addition, these systems are not suited for application as DUV resists, particularly due to the high self-absorption of novolak, for example, at 248 nm.

To eliminate the problems associated with the application of liquid-developable single-layer resists, so-called two-layer systems were developed. These systems, however, are more complicated. In the two-layer systems, a single thin upper layer is irradiated and structured (i.e., developed or chemically modified through treatment with an agent). The structure produced in the upper layer serves as a contact mask and is subsequently transferred to the lower layer(s). To structure the lower layer, UV-light provided by a flood exposure (i.e., irradiation without an overlay mask) can be used in conjunction with liquid-development or with dry-development techniques such as reactive ion etching in an oxygen plasma ($O_2$/RIE).

Dry-developable single-layer systems have the advantages of the two-layer systems, while being less complex. In these systems, a latent image is produced through the irradiation of the surface of a resist layer that has been deposited on the substrate. The resist is then treated with a metal-containing organic reagent (e.g., an organosilicon compound) whereby, depending on the type of process control desired, either only the exposed areas (negative resist) or only the unexposed areas (positive resist) react with the reagent. The non-silylated areas are then dry-developed by etching in an oxygen plasma.

To produce resist structures under 0.5 $\mu$m by means of dry-developable single-layer systems, the following resists/processing techniques are generally utilized:

(1) In European Published Patent Application 0 204 253, after exposure, a resist consisting of a novolak resin and a photoactive component is treated at 65° C. with a solution of hexamethylcyclotrisilazane in o-xylol and subsequently dry-developed; both negative and positive-resist structuring are possible.

(2) In European Published Patent Application 0 136 130, a resist based on acrylate is treated with diborane ($B_2H_6$) at 40° C. and dry-developed, after exposure to electron beams. A resolution of 0.5 $\mu$m is obtained (residual resist thickness: 0.18 $\mu$m). Similar results are obtained with a commercially available resist using silicon tetrachloride ($SiCl_4$) as a treating reagent. Depending on the process control, it is possible to produce positive or negative structures.

(3) In European Published Patent Applications 0 229 917 and 0 251 241, by treating exposed resists with isocyanates and silicon-containing reagents and subsequently subjecting them to dry development, positive images are obtained with suitable process control.

(4) In European Published Patent Application 0 248 779; *Proc. of SPIE*, Vol. 1086 (1989), pp. 220–228, and *J. Vac. Sci. Technol. B*, Vol. 7 (1989), pp. 1782–1786, by silylating resists using gas-phase silicon-containing reagents such as hexamethyldisilazane, positive resist images are produced.

The above systems, however, have the following disadvantages: (1) use of corrosive or poisonous, moisture-sensitive gases or liquids; (2) requirement for special apparatus with evacuating capability; (3) treatment at elevated temperatures; (4) long process times; and (5) low $O_2$/RIE resistance.

European Published Patent Application 0 394 740 proposes a negative working, dry-developable resist system which, contrary to comparable systems, permits easy handling, features a high selectivity in oxygen plasma, leads to highly resolved structures with steep edges, and finds application using existing equipment. An exceptional feature of this system is that the resist is treated with a metal-containing organic reagent in an aqueous or water-containing, non-toxic phase. This treatment occurs under normal conditions, i.e. at room temperature and standard pressure.

While negative working, dry-developable single-layer systems are generally easier to process than corresponding positive working systems, the positive systems are better suited for applications involving critical contact-hole planes. This, however, is a very important advantage.

SUMMARY OF THE INVENTION

An advantage of the present invention is the specifying of a method for producing a resist structure which, using standard equipment, leads to highly resolved structures with steep edges, even in the case of critical contact-hole planes.

This advantage is achieved according to the present invention by applying to a substrate a photoresist layer containing a polymer having chemically reactive groups and a photoactive component based on diazoketone or quinone diazide. The photoresist layer is then irradiated in the form of a patterned image and treated with a polyfunctional organic compound whose functional groups can chemically react with the reactive groups of the polymer. The photoresist is then subjected to a flood exposure and treated with a metal-containing organic compound that possesses at least one functional group that can chemically react with the reactive groups of the polymer. Finally, the photoresist layer is etched in an oxygen-containing plasma.

The present invention provides a structuring method for producing high resolution resist structures based on positive images by dry development that offers the advantages associated with positive-working resist systems. Moreover, this method also features advantages characteristic of comparable negative systems.

Generally, the method of the present invention comprises the following steps:

A resist consisting of a base polymer and a photoactive component is applied in the form of a solution to a substrate (e.g., a silicon wafer) and irradiated through an overlay mask. Although the base polymer contains chemically reactive groups, it is nevertheless stable in storage. Diazoketones or quinone diazides serve as photoactive components. Depending on the photoactive components (which must absorb and react in the range of exposure wavelengths) the resist can be irradiated in the near-UV or deep-UV (NUV or DUV) range (e.g., at 193, 248, 313, 365 or 436 nm).

After irradiation, the resist is treated for a short time with a so-called "cross-linking reagent," preferably provided in the form of an aqueous solution. These cross-linking agents are metal-free, organic compounds. They possess at least two functional groups that can chemically react with the reactive groups of the base polymer. As a result of this reaction, the base polymer is blocked in the irradiated areas. Treatment with the solution of the cross-linking agent presumably causes the carboxylic acid formed from the photoactive component during irradiation to be dissolved out of the resist The resist is preferably treated with the cross-linking reagent at room temperature; however, if necessary or advisable, this treatment can also take place at elevated temperatures.

The treatment of the resist with the cross-linking reagent is followed by a flood exposure (i.e., an irradiation without an overlay mask). Before the flood exposure, the resist is preferably subjected to an elevated temperature treatment where it is tempered for a short time (e.g., for 60 seconds, at 90°–110° C.). After the flood exposure, the resist is treated for a short time with a containing, organic compound, which possesses at least one functional group that can chemically react with the reactive groups of the base polymer. This treatment preferably takes place with an water-alcohol solution at room temperature.

It is believed that, as a result of the ensuing chemical reaction, the treatment of the resist with the metal-containing compound leads to a selective increase in layer thickness for the unblocked areas, i.e., for those areas that were exposed in the second irradiation. This layer growth, which in particular takes place vertically, can be selectively controlled and adjusted by means of the irradiation dose of the flood exposure and by the duration of the metal-compound treatment and the concentration of the solution, thereby used. Consequently, highly resolved sub-half-micron micron structures currently of approx. 0.25 $\mu$m with line/space ratios of 1:1 are produced. It is also possible to produce structures with considerably narrower spaces and a high aspect ratio. This resist system, therefore, has great potential for optimization.

After the treatment with the metal-containing compound, the resist is etched in oxygen plasma (i.e., a dry development process). Highly resolved, positive resist structures with steep edges are obtained thereby. Even when compared to the production of positive structures as indicated in European Published Patent Application 0 394 740 (Example 6), the method of the present invention has the advantage of clearly higher resolution. The known method also requires an additional resist component, specifically a photoactive acid producer.

When contrasted to known comparable methods, the advantages of the present invention include the following: (1) treatment of the resist with the chemical reagents at room temperature and climate (ease of process control); (2) short treatment times, generally 30 to 90 seconds; (3) the entire process can be completely integrated into existing installations—in other words, no additional investment is required. For example, the resist can be treated in existing puddle or spray developers; and (4) the areas of the resist treated with the metal-containing compound and metallized in this manner show high etching resistance to oxygen plasma.

In addition to single-layer systems, the invention can also find application in dry-developable two-layer systems. In this embodiment of the present invention, the reactive resist is applied as a thin layer to a etchable planarization layer, which can be freely selected according to the requirements at hand. Generally, semi-conductor material, metal, ceramic, or the like is used as a base, i.e., as a substrate.

With the method of the present invention, one preferably uses a base polymer featuring chemically reactive anhydride groups. Other reactive groups include epoxide and imide groups, isocyanate groups, possibly in capped form, and enolether groups. A copolymer built up of 10 to 55 mole % of maleic acid anhydride monomers is a suitable base polymer with anhydride groups; aromatic compounds such as styrol can be used as co-monomers. European Published Patent Application 0 394 740 specifies several other suitable polymers for this purpose.

Cross-linking agents suitable for use in the method of the present invention include but are not limited to a polyfunctional, metal-free organic compounds, preferably polyamines (i.e., compounds with at least two amino groups). Aliphatic polyamines, or even those with aromatic partial structures, are used for this purpose. Suitable polyfunctional amines include triethylenetetramine, tris(2-aminoethyl)-amine, N,N'-bis(3-aminopropyl)-1,2-ethylenediamine and (aminomethyl)-benzylamine. In addition to polyamines, compounds with at least two phenolic OH-groups and suitable polyfunctional alcohols may be used.

The cross-linking reagents may be applied in the form of aqueous solutions. If the cross-linking agent (e.g., the polyamine) is only slightly soluble or even insoluble in water, then one may also use solutions having various proportions of water and suitable organic solvents such as alcohols, particularly isopropanol.

Metal-containing organic compounds suitable for use in the method of the present invention include, but are not limited to, organosilicon compounds (e.g., a diaminosiloxane can be used for this purpose). Besides amino-functional organosiloxanes, other suitable compounds are hydroxy-functional organosiloxanes and amino- or hydroxy-functional organosilanes. These types of compounds are described in the European Published Patent Application 0 394 740. In addition to organosilicon compounds, other metal-containing organic compounds whose metals form stable oxides that are difficult to etch can be used, such as magnesium-, aluminum-, titanium-, vanadium- and tin-containing compounds.

The metal-containing organic compounds, generally silylating reagents, are applied in an water-alcohol solution. Isopropanol, in particular, is used as an alcohol.

DETAILED DESCRIPTION

The following examples are used to explain the present invention in greater detail. The following starting materials or treatment reagents are used in the examples:

Base polymer (1)

A copolymer of maleic anhydride and styrol, prepared through the radical polymerization of the two corresponding monomers with azoisobutyric-acid nitrile as an initiator and an alkylmercaptan as a regulator.

Base polymer (2)

A copolymer of maleic anhydride and styrol, prepared through the radical polymerization of the two corresponding monomers with azoisobutyric-acid nitrile as an initiator (without regulator).

Photoactive component (1)

Diester of bisphenol A with naphthoquinonediazide-4-sulphonic acid.

Cross-linking solution (1)

An aqueous solution consisting of 2 parts by weight of tris(2-aminoethyl)-amine and 98 parts by weight of water.

Cross-linking solution (2)

An aqueous solution consisting of 2 parts by weight of triethylene tetramine and 98 parts by weight of water.

Cross-linking solution (3)

An aqueous solution consisting of 2 parts by weight of N-(3-aminopropyl)-1,4-butanediamine and 98 parts by weight of water.

Cross-linking solution (4)

An aqueous solution, consisting of 2 parts by weight of N,N'-bis(3-aminopropyl)-1,4-butanediamine and 98 parts by weight of water.

Cross-linking solution (5)

An aqueous solution consisting of 4 parts by weight of N,N'-bis(3-aminopropyl)-1,2-ethylenediamine and 96 parts by weight of water.

Silylation solution (1)

A water-alcohol solution consisting of 2 parts by weight of diaminosiloxane, 78.4 parts by weight of isopropanol and 19.6 parts by weight of water. An $\alpha, \omega$-aminofunctional siloxane is preferably used, particularly one with two terminal aminopropyl groups and 2 to 20 silicon atoms in the chain, for example, the commercial product Tegomer A-Si 2120 (Firm Goldschmidt).

Silylation solution (2)

A water-alcohol solution consisting of 1 part by weight of diaminosiloxane (Tegomer A-Si 2120), 79.2 parts by weight of isopropanol and 19.8 parts by weight of water.

Silylation solution (3)

An aqueous solution consisting of 2 parts by weight bis(3-aminopropyl)-tetramethyldisiloxane, 1 part by weight of emulsifier and 97 parts by weight of water.

Example 1

The commercially available positive resist TSMR 8900 (Tokyo Ohka Kogyo Co.) is centrifuged onto a silicon wafer (4000 rpm, 20 seconds) and dried for 5 min. at 90° C.; it is then baked for 35 min. in a forced-air oven at 240° C. After baking, the thickness of the resist is 1.3 $\mu$m; it serves as a planarization layer.

A resist consisting of 9.75 parts by weight of base polymer (1), 5.25 parts by weight of photoactive component (1), and 85 parts by weight of 2-methoxy-1-propylacetate is centrifuged onto the planarization layer (4500 rpm, 20 seconds). After drying at 100° C. for 60 seconds on a hot plate, the layer thickness of this top resist is 320 nm. The resist is then irradiated through an overlay mask with 100 mJ/cm$^2$ (Canon DUV stepper: $\lambda=248$ nm, NA=0.37), treated for 60 seconds with the cross-linking solution (1), rinsed for 30 seconds with water, and tempered for 2 min. at 100° C. After a DUV flood exposure (without overlay mask) with 150 mJ/cm$^2$, the resist is treated for 45 seconds with silylation solution (1) and then rinsed for 30 seconds with isopropanol. In this case, the only areas silylated are those not exposed during the first irradiation. The silicon wafer is subsequently placed in a plasma-etching installation (Leybold Heraeus, type Z 401) and the resist is dry-developed in an oxygen plasma (O$_2$/RIE: 6 mTorr gas pressure, 500 V bias voltage). Positive structures of 0.3 $\mu$m are obtained with vertical edges and a line/space ratio of 1:1.

EXAMPLE 2

A resist corresponding to Example 1 is applied to the base in the manner described, dried, irradiated through an overlay mask with 70 mJ/cm$^2$, treated for 60 seconds with the cross-linking solution (2) and rinsed for 30 seconds with water. After tempering, DUV flood exposure and silylation in accordance with Example I, it is dry-developed in a plasma-etching installation (Material Research Corporation, type MIE 720) with an oxygen plasma (O$_2$/RIE: 6 mTorr gas pressure, 50 V bias voltage, with magnet) Positive structures with vertical edges having dimensions of 0.25 $\mu$m are obtained.

EXAMPLE 3

A resist corresponding to Example 1 is applied to the base in the manner described in Example 2, dried, irradiated, treated for 60 seconds with the cross-linking solution (3) and rinsed for 30 seconds with water. After NUV flood exposure (without overlay mask) with approx. 200 mJ/cm2 and further treatment in accordance with Example 1, positive structures having dimensions of 0.4 $\mu$m with vertical edges and a line/space ratio of 1:1 are obtained.

EXAMPLE 4

A resist corresponding to Example 1 is irradiated through an overlay mask with 40 mJ/cm$^2$ (ASM stepper: $\lambda=365$ nm, NA=0.4), treated for 45 seconds with the cross-linking solution (5), rinsed for 30 seconds with water and tempered for 2 min. at 110° C. After a NUV flood exposure (without overlay mask) with approx. 200 mJ/cm$^2$, the resist is treated for 30 seconds with silylation solution (1) and rinsed for 30 seconds with isopropanol. The silicon wafer is then placed in a plasma-etching installation (Leybold Heraeus, type Z 401) and the resist is dry-developed in an oxygen plasma (O$_2$/RIE: 6 mTorr gas pressure, 450 V bias voltage). Positive structures having dimensions of 0.5 μm are obtained with vertical edges.

EXAMPLE 5

A resist consisting of 13 parts by weight of base polymer (2), 7 parts by weight of photoactive component (1), and 80 parts by weight of 2-methoxy-1-propylacetate is centrifuged onto a silicon wafer (3000 rpm, 20 seconds). After drying at 100° C. for 60 seconds on a hot plate, the layer thickness of this resist is 1.1 μm. The resist is then irradiated through an overlay mask with 80 mJ/cm$^2$ (Canon DUV stepper: λ=248 nm, NA=0.37), treated for 60 seconds with the cross-linking solution (4), rinsed for 30 seconds with water, and tempered for two min. at 100° C. After a DUV flood exposure (without overlay mask) with 150 mJ/cm$^2$, the resist is treated for 30 seconds with silylation solution (2) and then rinsed for 30 seconds with isopropanol. The silicon wafer is then placed in a plasma-etching installation (Leybold Heraeus, type Z 401) and the resist is dry-developed in an oxygen plasma (O$_2$/RIE: 6 mTorr gas pressure, 500 V bias voltage). Positive structures having dimensions of 0.4 μm are obtained with near-vertical edges.

EXAMPLE 6

A resist corresponding to Example 5 is contact-printed through an overlay mask with 40 mJ/cm$^2$ (unit MA 56 M / Karl Süss: λ=363 nm), treated for 60 seconds with the crosslinking solution (2), rinsed for 30 seconds with water and tempered for 2 min at 100° C. After a NUV flood exposure (without overlay mask) with 180 mJ/cm$^2$, the resist is treated for 60 seconds with silylation solution (3) and then rinsed for 30 seconds with isopropanol. Dry development is then conducted in a plasma-etching installation (Leybold Heraeus, type Z 401) with an oxygen plasma (O$_2$/RIE: 6 mTorr gas pressure, 500 V bias voltage). Positive structures having dimensions of 0.5 μm are obtained with vertical edges.

EXAMPLE 7

A resist corresponding to Example 1 is irradiated through an overlay mask with 120 mJ/cm$^2$ (Canon DUV stepper: λ=248 nm, NA=0.37), treated for 60 seconds with cross-linking solution (2), rinsed for 30 seconds with water, and tempered for 2 min. at 100° C. After a DUV flood exposure (without overlay mask) with approx. 200 mJ/cm$^2$, the resist is treated for 60 seconds with silylation solution (1) and then rinsed for 30 seconds with isopropanol. Dry development then takes place in a plasma-etching installation (Leybold Heraeus, type Z 401) with an oxygen plasma (O$_2$/RIE: 6 mTorr gas pressure, 500 V bias voltage). Spaces 0.15 μm wide are obtained in the approx. 1.7 μm thick resist layer.

What is claimed is:

1. A method for producing high resolution resist structures with steep edges, comprising the steps of:
    applying to a substrate a photoresist layer comprising a polymer having chemically reactive groups and a photoactive component selected from the group consisting of diazoketone and quinone diazide;
    irradiating the applied photoresist layer with a patterned image;
    treating the irradiated photoresist layer with a polyfunctional metal-free organic compound cross-linking agent having functional groups that chemically react with the reactive groups of the polymer in the irradiated areas to block the polymer;
    exposing the treated photoresist layer to a flood exposure;
    treating the flood exposed photoresist layer with a metal-containing organic compound having at least one functional group that chemically reacts with the reactive groups of the polymer in the unblocked areas; and
    etching the resulting photoresist layer in an oxygen-containing plasma.

2. The method of claim 1, wherein the polymer contains chemically anhydride groups.

3. The method of claim 2, wherein the polyfunctional organic compound is a polyamine.

4. The method of claim 3, wherein the polyamine is an aliphatic polyamine.

5. The method of claim 4, wherein the metal-containing organic compound is an organosilicon compound.

6. The method of claim 5, wherein the organosilicon compound is a diaminosiloxane.

7. The method of claim 6, wherein the step of treating the irradiated photoresist layer with a polyfunctional organic compound is conducted at room temperature.

8. The method claim 7, wherein the step of treating the flood exposed photoresist layer with a metal-containing organic compound is conducted by means of a water-alcohol-based solution.

9. The method of claim 8, further comprising the step of:
    subjecting the treated photoresist layer to an elevated temperature prior to the step of exposing the treated photoresist layer to a flood exposure.

10. The method of claim 9, wherein the substrate is a dry-etchable planarization layer.

11. The method of claim 2, wherein the metal-containing organic compound is an organosilicon compound.

12. The method of claim 11, wherein the organosilicon compound is a diaminosiloxane.

13. The method of claim 1, wherein the polyfunctional organic compound is a polyamine.

14. The method of claim 13, wherein the polyamine is an aliphatic polyamine.

15. The method of claim 1, wherein the metal-containing organic compound is an organosilicon compound.

16. The method of claim 15, wherein the organosilicon compound is a diaminosiloxane.

17. The method of claim 1, wherein the step of treating the irradiated photoresist layer with a polyfunctional organic compound is conducted at room temperature.

18. The method of claim 1, wherein the step of treating the flood exposed photoresist layer with a metal-containing organic compound is conducted by means of a water-alcohol-based solution.

19. The method of claim 1, further comprising the step of:
    subjecting the treated photoresist layer to an elevated temperature prior to the step of exposing the treated photoresist layer to a flood exposure.

20. The method of claim 1, wherein the substrate is a dry-etchable planarization layer.

* * * * *